United States Patent [19]

Peters

[11] Patent Number: 4,848,090
[45] Date of Patent: Jul. 18, 1989

[54] APPARATUS FOR CONTROLLING THE TEMPERATURE OF AN INTEGRATED CIRCUIT PACKAGE

[75] Inventor: Alfred C. Peters, Garland, Tex.

[73] Assignee: Texas Instruments Incorporated, Dallas, Tex.

[21] Appl. No.: 148,819

[22] Filed: Jan. 27, 1988

[51] Int. Cl.[4] .................... F25B 21/02; F25B 29/00; H01L 23/28
[52] U.S. Cl. ............................................ 62/3.3; 62/5; 62/160; 165/27; 236/78 B; 361/384
[58] Field of Search .................... 62/3, 5, 160, 159; 165/27; 236/78 B, 78 H; 361/381

[56] References Cited

U.S. PATENT DOCUMENTS

| | | | |
|---|---|---|---|
| 2,777,975 | 1/1957 | Aigrain | 62/3 |
| 3,309,881 | 3/1967 | Beerman | 62/3 |
| 4,402,185 | 9/1983 | Perchak | 62/3 |
| 4,719,830 | 1/1988 | Kawarda et al. | 236/78 B |

Primary Examiner—Albert W. Davis, Jr.
Attorney, Agent, or Firm—Joseph E. Rogers; James T. Comfort; Melvin Sharp

[57] ABSTRACT

A thermoelectric heat pump is used to maintain the temperature of an integrated circuit under test. Temperature sensors placed on two sides of the integrated circuit measure and generate signals indicative of the temperature at the two surfaces, and the average of the two measured temperatures is compared against a value of a preset temperature to change the temperature of the heat pump to stabilize the temperature of the integrated circuit to a desired value.

19 Claims, 3 Drawing Sheets

APPARATUS FOR CONTROLLING THE TEMPERATURE OF AN INTEGRATED CIRCUIT PACKAGE

FIELD OF THE INVENTION

This invention relates to semiconductor devices and more particularly to an apparatus for accurately controlling the temperature of a semiconductor device under test.

BACKGROUND OF THE INVENTION

In testing semiconductor devices and determining operating characteristic of the semiconductor device, test must be run on the device at various temperatures.

The semiconductor device is usually placed in a variable temperature controlled environment. The problem that exist is in accurately determining the device temperature, finding accurate temperature ovens that are easily movable and yet give accurate measurement of the temperature of the semiconductor device.

Even in currently available equipment, it is very costly to achieve and maintain a temperature of +/−1 degrees C. Achieving temperatures of +/−0.5 degree is even more costly.

Current methods blow air over electric coils. Dried air or dry nitrogen is blown through a freon evaporator for cold air. Cold air may also be obtained by injecting nitrogen into an air stream. To achieve uniform temperatures, the air must be uniformly directed on each device. This is difficult to do in a production environment.

Temperature calibration is required whenever a change in volume or direction of air flow is made.

In order to repair current temperature test chambers, it is necessary to bring the chamber to room temperature. After repair it takes time to bring the chamber back up to a stable temperature.

A further feature of the current temperature chambers is that air temperature is measured, not the temperature of the device.

BRIEF DESCRIPTION OF THE INVENTION

The invention is an apparatus and method for accurately determining the temperature of a semiconductor device, for device characterization of semiconductor devices at specific temperatures, and for other engineering purposes.

A thermoelectric heat pump is used to either heat or cool the semiconductor device. The thermoelectric heat pump is a device that when power is applied to the two terminals, one side of the device is cool and the other side is hot. Therefore, such a device may be used to either cool or heat a device under test. The cool and hot sides may be interchanged by reversing the polarity of the power applied to the heat pump terminals. Such a heat pump is manufactured by Marlow Industries, Inc.

Temperature sensors are placed both on top and bottom of the semiconductor device. The temperature data from each sensor is compared with a programmed temperature setting. The programmed temperature setting is originally a digital value. This programmed temperature setting is changed to an analog signal with a value of twice the then current value of the value of the data from the two sensors.

The programmed value is compared to the two sensor readings in a summing circuit. If the value of the sum of the two sensor values is equal to the value of the processed programmed value, then there is no change signal sent to the heat pump, but if there is a difference, then a signal is sent to the heat pump to either increase or decrease the temperature of the semiconductor, dependent upon whether the semiconductor needs to be heated or cooled to bring the temperature of the device equal to that of the programmed temperature.

The technical advance represented by the invention as well as the objects thereof will become apparent from the following description of a preferred embodiment of the invention when considered in conjunction with the accompanying drawings, and the novel features set forth in the appended claims.

DESCRIPTION OF A PREFERRED EMBODIMENT OF THE INVENTION

Figure 1:
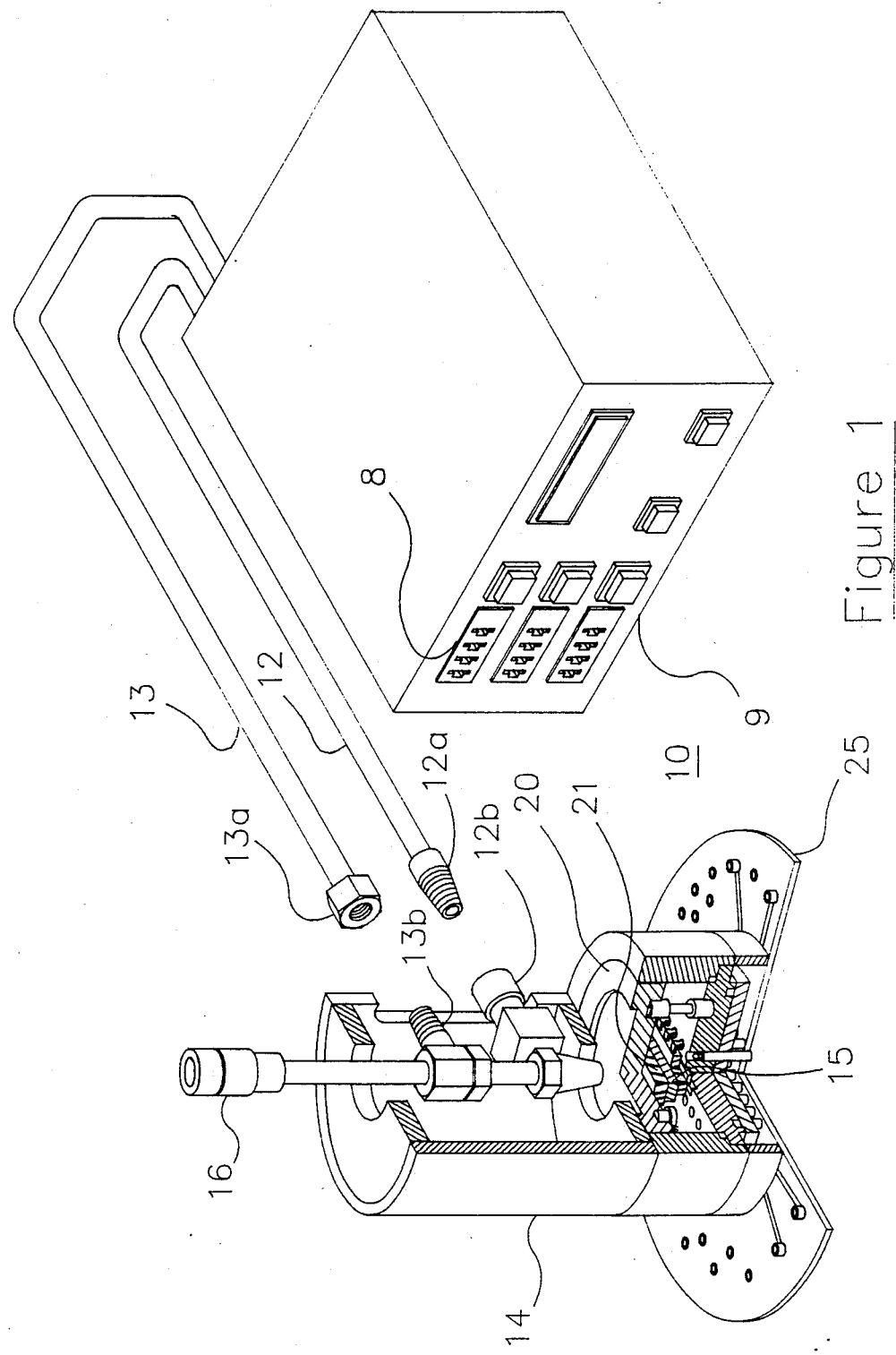
FIG. 1. illustrates the heat pump/test system of the invention.

FIG. 1 illustrates one embodiment of the present invention. A thermoelectric heat pump is used to either heat or cool a semiconductor device 15 placed in a test fixture 14. Temperature sensors are placed both on top and bottom of the semiconductor device. The temperature data from each sensor is compared with a programmed temperature setting, set from a system control panel 8. The programmed temperature setting is originally a digital value. This programmed temperature setting is changed to an analog signal with a value equal to the then current value of the value of the sum of the data from the two sensors.

The system 10 has two major components, the control/ monitor housing 9 which encloses the control circuitry for a heat pump and the circuitry for comparing temperatures measured during any test.

Control housing 9 is connected to the test fixture 14 by two tubes, 12 and 13. Tube 12 is a vacuum line that pulls a vacuum around the heat pump and the integrated circuit device under test. By creating a vacuum, the environment around the device under test is stabilized with a minimum lost of heating of cooling within the test environment. Tube 12 also carries the connections to the heat pump and the sensors within the housing 9. Tube 13 carries air into a vortex tube assembly 16 that separates hot and cold air. Hot air is directed out of the top of 16 and cool air is directed on to a heat sink 20 for cooling purposes. The two tubes 12 and 13 have fittings 12a and 13a that connect tubes 12 and 13 to the test fixture at fittings 12b and 13b. The heat sink 20 is used to absorb heat from the heat pump 21.

The integrated circuit 15 is placed in a socket by vertically moving the heat pump away from the integrated mounting socket by lifting the vortex tube assembly, heat pump and heat sink, all arranged in the housing 14.

Figure 2:
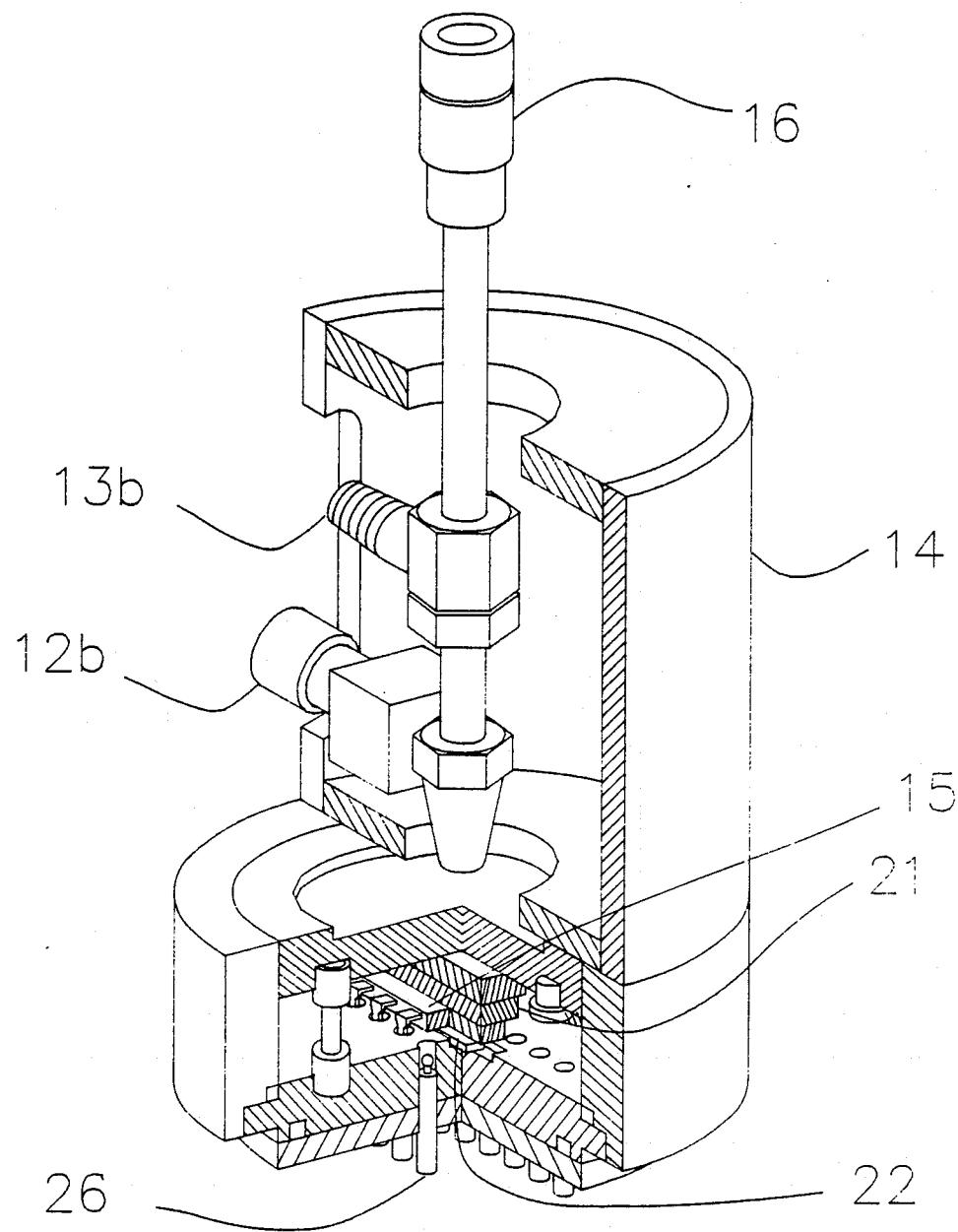
FIG. 2 illustrates a test fixture and device housing.
Figure 3:
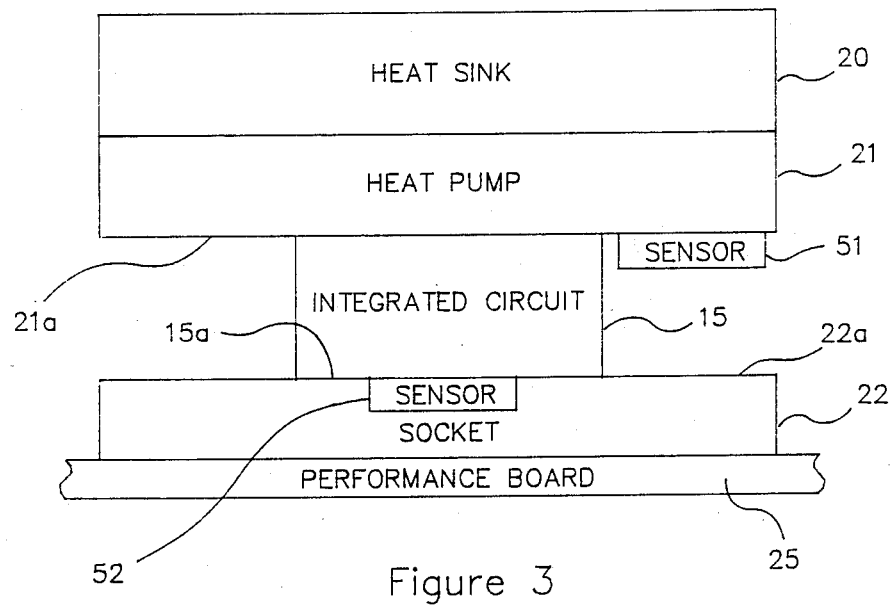
FIG. 3 illustrates a simplified diagram of the test fixture and device housing of FIG. 2.

FIG. 2 is a more detailed drawing of the test fixture and heat pump housing 14. Integrated circuit 15 is mounted in device socket 22. A first sensor S1 is mounted against the heat pump 21. A temperature sensor S2 is mounted in the device socket 22 so that it is in contact with the bottom of the integrated circuit 15 mounted in device socket 22. Since the top of the integrated circuit 15 is in contact with the heat pump 21, sensor 1 detects the temperature of the top of integrated circuit 15 as well as the temperature of heat pump 21.

The heat sensors S1 and S2 are connected by circuitry (not illustrated) to the control housing 9 by connections that go through vacuum tube 12 to the control housing 9. Circuit board 25 is connected to pins 26 which are connected to the socket in which the device under test is mounted. Pins 22 are spring loaded so that when the device under test is placed in the socket, and the heat pump is lowered onto the device, the pins are brought into contact with the pins of the device as well as the contacts on circuit board 25.

Heat sink 20, heat pump 21 and sensor S1 are all mounted together so that they may be raised by lifting housing 14 to permit integrated circuit 15 to be placed in or removed from device socket 22.

Integrated circuit 15 is firmly held in place by heat pump 21 during test so that the heat pump 21 and integrated circuit 15 are in good thermal contact.

Sensor 2, which is mounted in device socket 22 is in the upper part of the socket so that when the integrated circuit 15 is clamped in place, sensor S2 is also in good thermal contact with the the bottom side of integrated circuit 15.

FIG. 13 illustrates the relative positions of the heat sink, heat pump, integrated circuit, device socket and heat sensors with each other. The heat sink 20 and heat pump 21 are mounted together in direct contact. Sensor S1 is mounted on the lower surface 21a of the heat pump. This permits sensor S1 to measure the temperature at surface 21a of the heat pump. Integrated circuit 15 is mounted such that when the heat sink 20 and heat pump 21 are placed in contact with integrated circuit 15, the lower surface 21a of the heat pump is in contact with the integrated circuit 15.

Therefore, the temperature measured by sensor S1 is indicative of the temperature of the surface of the integrated circuit 15 in contact with heat pump surface 21a.

Sensor S2 is mounted in device socket 22. Sensor S2 is mounted in the top part of socket 22 such that the upper surface of sensor S2 is flush with top surface 22a of socket 22.

Therefore, when integrated circuit 15 is mounted in socket 22, then the bottom surface of integrated circuit 15 is in contact with sensor S2. Sensor S2 then measures the temperature at the bottom surface of integrated circuit 15.

Socket 22 is connected to performance board 25. Tests on the device under test are conducted by connecting the test instruments, as well as power to the device, to the performance board 25.

Figure 4:
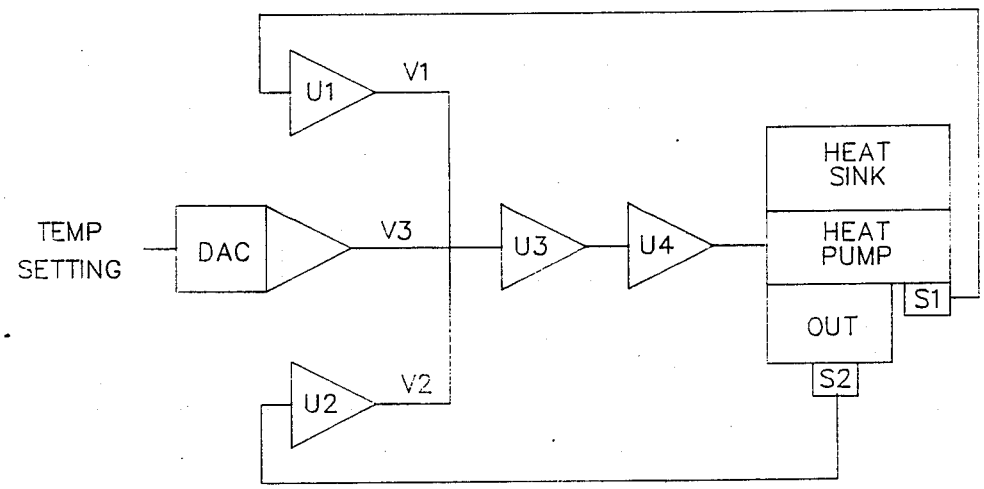
FIG. 4 is a simplified circuit diagram of the temperature measuring circuit of the invention.

FIG. 4 is a circuit diagram of the sensor circuit for accurately determining the temperature of the device under test (DUT). A solid state controller monitors the Sensors S1 and S2 that are mounted on each side of the DUT. Sensor S1 is mounted on the bottom side of the heat pump and effectively measures the temperature at the heatpump-DUT interface (top surface of the DUT). Sensor S2 measures the temperature at the bottom surface of the DUT.

Circuit U1 is a signal conditioner for the output of Sensor S1 and produces a value V1, and circuit U2 is a signal conditioner for the output of Sensor S2 and produces a value V2. A digital-to-analog converter (DAC) converts a preset temperature signal, set by the operator at the control panel 8 of control unit 9 (FIG. 1).

The preset temperature signal is changed to an analog value V3 having the magnitude of the sum of the signals from S1 and S2, and of the opposite polarity. The preset or programmed value V3 is compared to V1 and V2 in the summing junction of U3. If the sum of the values V1 and V2 equals that of V3, then U3 will have a zero output to power operational amplifier U4. If the sum of the values of V1 and V2 is less than or greater than V3, then U4 will output a voltage to the heat pump changing the output of the heat pump to change the temperature of the DUT until the average of V1 and V2 equals that of V3.

The temperature of the DUT is very accurate and is the average of the temperatures measured by the two sensors S1 and S2. The DUT temperature can be maintained +/−0.5 degree C. Since the test fixture 14 and the Control unit 9 are small, they may be moved easily from one work bench to another as need.

What is claimed:

1. An apparatus for controlling the temperature of an integrated circuit device and maintaining said integrated circuit device at a preset temperature, comprising; a variable temperature device adjacent said integrated circuit, two temperature sensing devices mounted on two sides of the integrated circuit device, each sensing device having an output, and a controller circuit for comparing the output from each integrated circuit device with a signal indicative of said preset temperature, to maintain said integrated circuit device at said preset temperature.

2. The apparatus according to claim 1, wherein said variable temperature device is a thermoelectric heat pump.

3. The apparatus according to claim 1, wherein said two temperature sensing devices are mounted on two opposite sides of the integrated circuit device.

4. The apparatus according to claim 3, wherein said temperature sensing devices are mounted on the two opposite sides of said integrated circuit device and are in thermal contact therewith.

5. The apparatus according to claim 1, wherein said controller circuit includes an digital-to-analog circuit for converting a value representative of the preset temperature signal to an analog value, and said controller circuit has a circuit for comparing the outputs from the sensing devices with said value representative of the preset temperature signal.

6. The apparatus according to claim 1, including a fixture which clamps the integrated circuit device in a socket between the socket and said variable temperature device.

7. The apparatus according to claim 6, wherein said socket is interconnected with a printed circuit board for interconnecting the integrated circuit device with testing and comparing circuitry.

8. An apparatus for measuring the temperature of an integrated circuit device and maintaining said integrated circuit device at a preset temperature, comprising, a test fixture including a heat pump, a heat pump control system, first and second heat sensors for producing signals indicative of the temperature sensed by the heat sensors, and a socket for holding said integrated circuit device, said heat pump having said first heat sensor mounted on one surface thereof, said socket having the second heat sensor mounted therein, said integrated circuit mounted in said socket and having one side thereof in contact with said second heat sensor mounted in said socket, and another side of said integrated circuit device in contact with the surface of said heat pump having said first heat sensors mounted thereon, wherein said heat pump and heat pump control system maintains the integrated circuit device at a preset temperature dependent upon the signals produced by said first and second heat sensors.

9. The apparatus according to claim 8, wherein said fixture includes a vortex tube and a heat sink attached to said heat pump, said vortex tube carrying cool air to said heat sink.

10. The apparatus according to claim 8, wherein said heat pump control system is connected to the heat pump by wires extending through a vacuum line.

11. The apparatus according to claim 10, wherein said heat pump is a thermoelectric heat pump.

12. The apparatus according to claim 8, wherein said first and second temperature sensing devices are mounted on two opposite sides of the integrated circuit device.

13. The apparatus according to claim 8, wherein said temperature sensing devices are mounted on two opposite sides of said integrated circuit device, and are in thermal contact therewith.

14. The apparatus according to claim 8, wherein said heat pump control system includes an digital-to-analog circuit for converting a value representative of a preset temperature signal to an analog value, and said control system has a circuit for comparing the outputs from said first and second heat sensors with said value representative of the preset temperature signal.

15. The apparatus according to claim 8, wherein said socket is interconnected with a printed circuit board for interconnecting the integrated circuit device with testing and comparing circuitry.

16. A method of maintaining an integrated circuit device at a preset temperature, comprising the steps of:
measuring the temperature of the integrated circuit device at two opposite surfaces of the integrated circuit device,
comparing the sum of the two measured temperatures against a preset temperature value, and
adjusting the temperature of the integrated circuit device, which is in contact with one surface of a heat pump, by changing the temperature of the heat pump when the sum of the two measured temperature values is not equal to the preset temperature value.

17. The method according to claim 16, wherein the preset temperature value is converted from a digital to an analog signal of a polarity opposite the two measured temperature values, and is summed with the average of the two measured temperature values.

18. The method according to claim 16, wherein the temperature of the integrated circuit device is the average of the two measured temperatures at the opposite surfaces of the integrated circuit device.

19. The method according to claim 16, wherein the difference between the preset temperature value and the average of the two measured temperature values is used to adjust the temperature of the heat pump.

* * * * *